United States Patent
Campbell

(10) Patent No.: US 7,868,310 B2
(45) Date of Patent: Jan. 11, 2011

(54) RESISTANCE VARIABLE MEMORY DEVICE AND METHOD OF FABRICATION

(75) Inventor: Kristy A. Campbell, Boise, ID (US)

(73) Assignee: Micron Technology, Inc., Boise, ID (US)

(*) Notice: Subject to any disclaimer, the term of this patent is extended or adjusted under 35 U.S.C. 154(b) by 195 days.

(21) Appl. No.: 12/068,108

(22) Filed: Feb. 1, 2008

(65) Prior Publication Data

US 2008/0164456 A1 Jul. 10, 2008

Related U.S. Application Data

(60) Continuation of application No. 11/511,312, filed on Aug. 29, 2006, now Pat. No. 7,348,209, which is a division of application No. 10/893,299, filed on Jul. 19, 2004, now Pat. No. 7,190,048.

(51) Int. Cl.
*H01L 45/00* (2006.01)
(52) U.S. Cl. .................... 257/1; 257/529; 257/E45.002; 365/46; 365/148
(58) Field of Classification Search ................ 257/528, 257/529, E31.001, 1–5, E45.001–E45.004; 365/46, 148
See application file for complete search history.

(56) References Cited

U.S. PATENT DOCUMENTS

| | | | |
|---|---|---|---|
| 5,389,475 A * | 2/1995 | Yanagisawa et al. | 430/19 |
| 6,795,338 B2 * | 9/2004 | Parkinson et al. | 365/163 |
| 7,190,048 B2 * | 3/2007 | Campbell | 257/613 |
| 2003/0156452 A1 | 8/2003 | Gilton | |
| 2003/0209971 A1 | 11/2003 | Kozicki | |
| 2004/0042259 A1 | 3/2004 | Campbell et al. | |
| 2004/0179390 A1 | 9/2004 | Campbell et al. | |
| 2004/0233748 A1 * | 11/2004 | Terao et al. | 365/202 |
| 2006/0011910 A1 | 1/2006 | Campbell | |
| 2006/0186394 A1 | 8/2006 | Campbell | |

OTHER PUBLICATIONS

International Search Report and Written Opinion dated Oct. 31, 2006 issued in International Application No. PCT/US2006/020242.
International Preliminary Report and Written Opinion dated Dec. 27, 2007 issued in International Application No. PCT/US2006/020242.

* cited by examiner

*Primary Examiner*—Marcos D. Pizarro
(74) *Attorney, Agent, or Firm*—Dickstein Shapiro LLP

(57) ABSTRACT

Methods and apparatus for providing a resistance variable memory device with agglomeration prevention and thermal stability. According to one embodiment, a resistance variable memory device is provided having at least one tin-chalcogenide layer proximate at least one chalcogenide glass layer. The invention also relates to methods of forming such a memory device.

32 Claims, 17 Drawing Sheets

RESISTANCE VARIABLE MEMORY DEVICE AND METHOD OF FABRICATION

This application is a continuation of U.S. patent application Ser. No. 11/511,312, filed Aug. 29, 2006, now U.S. Pat. No. 7,348,209, which is a divisional of U.S. patent application Ser. No. 10/893,299, filed Jul. 19, 2004, now U.S. Pat. No. 7,190,048, the entirety of each is hereby incorporated by reference herein.

FIELD OF THE INVENTION

The invention relates to the field of random access memory (RAM) devices formed using a resistance variable material.

BACKGROUND

Resistance variable memory elements, which include Programmable Conductive Random Access Memory (PCRAM) elements, have been investigated for suitability as semi-volatile and non-volatile random access memory devices. A typical PCRAM device is disclosed in U.S. Pat. No. 6,348,365 to Moore and Gilton.

In a typical PCRAM device, a conductive material, such as silver, is incorporated into a chalcogenide glass. The resistance of the chalcogenide glass can be programmed to stable higher resistance and lower resistance states. An unprogrammed PCRAM device is normally in a higher resistance state. A write operation programs the PCRAM device to a lower resistance state by applying a voltage potential across the chalcogenide glass and forming a conductive pathway. The PCRAM device may then be read by applying a voltage pulse of a lesser magnitude than required to program it; the resistance across the memory device is then sensed as higher or lower to define the ON and OFF states.

The programmed lower resistance state of a PCRAM device can remain intact for an indefinite period, typically ranging from hours to weeks, after the voltage potentials are removed; however, some refreshing may be useful. The PCRAM device can be returned to its higher resistance state by applying a reverse voltage potential of about the same order of magnitude as used to write the device to the lower resistance state. Again, the higher resistance state is maintained in a semi- or non-volatile manner once the voltage potential is removed. In this way, such a device can function as a variable resistance memory having at least two resistance states, which can define two respective logic states, i.e., at least a bit of data.

One exemplary PCRAM device uses a germanium selenide (i.e., $Ge_xSe_{100-x}$) chalcogenide glass as a backbone. The germanium selenide glass has, in the prior art, incorporated silver (Ag) and silver selenide ($Ag_{2+/-x}Se$).

Previous work by the inventor has been directed to PCRAM devices incorporating a silver-chalcogenide material, as a layer of silver selenide or silver sulfide in combination with a silver-metal layer and a chalcogenide glass layer. Although the silver-chalcogenide materials of the prior art memory devices are suitable for assisting in the formation of a conductive channel through the chalcogenide glass layer for silver ions to move into, other non-silver-based chalcogenide materials may be desirable because of certain disadvantages associated with silver use. For example, use of silver-containing compounds/alloys such as $Ag_2Se$ may lead to agglomeration problems in the PCRAM device layering and Ag-chalcogenide-based devices cannot withstand higher processing temperatures, e.g., approaching 260° C. and higher. Tin (Sn) has a reduced thermal mobility in $Ge_xSe_{100-x}$ compared to silver and the tin-chalcogenides are less toxic than the silver-chalcogenides.

Research has been conducted into the use of thin films of SnSe (tin selenide) as switching devices under the application of a voltage potential across the film. It has been found that a 580 Å SnSe film shows non-volatile switching between a higher resistance state (measurable in MOhm) and a lower resistance state (measurable in kOhm) when potentials of 5-15 V are applied by forming an Sn-rich material (e.g., a dendrite). Also, the addition of Sn to a $Ge_xSe_{100-x}$ glass, which is a chalcogenide glass, has been found to produce memory switching if a high enough potential, e.g., >40 V, is applied across the chalcogenide glass. However, such switching potentials are too high for a viable memory device.

SUMMARY

The invention provides a resistance variable memory device and a method of forming a resistance variable memory device.

In one exemplary embodiment, the invention provides a memory device having a stack with at least one layer of tin-chalcogenide (e.g., $Sn_{1+/-x}Se$, where x is between about 1 and 0) proximate a first chalcogenide glass layer. The stack of layers comprising a first chalcogenide glass layer and a tin-chalcogenide layer is formed between two conductive layers or electrodes. In other exemplary embodiments of the invention, similar memory device stacks may contain more than one chalcogenide glass layer and an optional metal layer. The invention provides structures for PCRAM devices with improved temperature tolerance and methods for forming such devices.

The above and other features and advantages of the invention will be better understood from the following detailed description, which is provided in connection with the accompanying drawings.

DETAILED DESCRIPTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit, including, but not limited to, metals, alloys, glasses, polymers, ceramics, and any other supportive materials as is known in the art.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "tin" is intended to include not only elemental tin, but tin with other trace metals or in various alloyed combinations with other metals as known in the semiconductor industry, as long as such tin alloy is conductive, and as long as the physical and electrical properties of the tin remain unchanged.

The term "tin-chalcogenide" is intended to include various alloys, compounds, and mixtures of tin and chalcogens (e.g., sulfur (S), selenium (Se), tellurium (Te), polonium (Po), and oxygen (O)), including some species which have a slight excess or deficit of tin. For example, tin selenide, a species of tin-chalcogenide, may be represented by the general formula $Sn_{1+/-x}Se$. Though not being limited by a particular stoichiometric ratio between Sn and Se, devices of the present invention typically comprise an $Sn_{1+/-x}Se$ species where x ranges between about 1 and about 0.

The term "chalcogenide glass" is intended to include glasses that comprise at least one element from group VIA (or group 16) of the periodic table. Group VIA elements (e.g., O, S, Se, Te, and Po) are also referred to as chalcogens.

Figure 1:
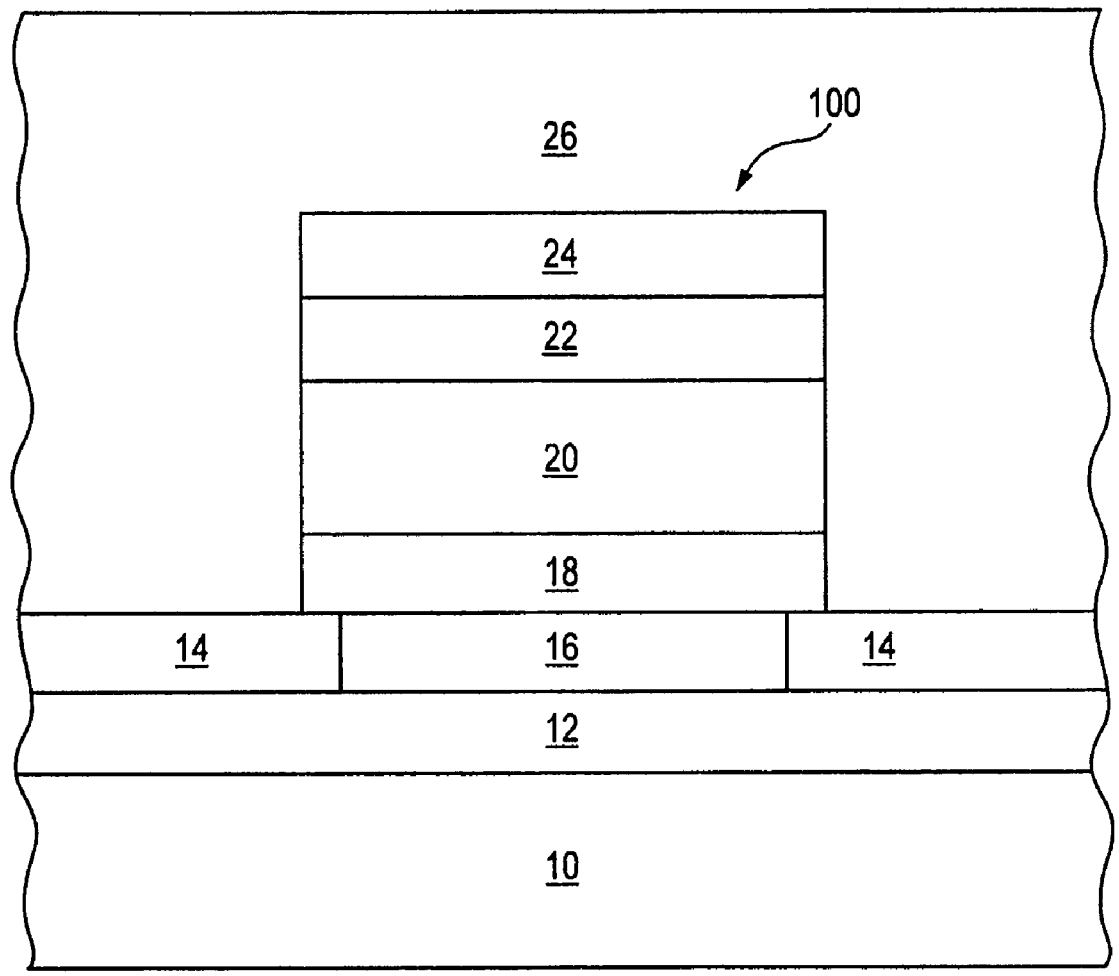
FIGS. 1-10 are illustrations of exemplary embodiments of memory devices in accordance with the invention.

The invention is now explained with reference to the figures, which illustrate exemplary embodiments and throughout which like reference numbers indicate like features. FIG. 1 shows an exemplary embodiment of a memory device 100 constructed in accordance with the invention. The device 100 shown in FIG. 1 is supported by a substrate 10. Over the substrate 10, though not necessarily directly so, is a conductive address line 12, which serves as an interconnect for the device 100 shown and a plurality of other similar devices of a portion of a memory array of which the shown device 100 is a part. It is possible to incorporate an optional insulating layer (not shown) between the substrate 10 and address line 12, and this may be preferred if the substrate 10 is semiconductor-based. The conductive address line 12 can be any material known in the art as being useful for providing an interconnect line, such as doped polysilicon, silver (Ag), gold (Au), copper (Cu), tungsten (W), nickel (Ni), aluminum (Al), platinum (Pt), titanium (Ti), and other materials. Over the address line 12 is a first electrode 16, which is defined within an insulating layer 14, which is also over the address line 12. This electrode 16 can be any conductive material that will not migrate into chalcogenide glass, but is preferably tungsten (W). The insulating layer 14 should not allow the migration of silver ions and can be an insulating nitride, such as silicon nitride ($Si_3N_4$), a low dielectric constant material, an insulating glass, or an insulating polymer, but is not limited to such materials.

A memory element, i.e., the portion of the memory device 100 which stores information, is formed over the first electrode 16. In the embodiment shown in FIG. 1, a layer of chalcogenide glass 18, preferably germanium selenide ($Ge_xSe_{100-x}$), is provided over the first electrode 16. The germanium selenide is preferably within a stoichiometric range of about $Ge_{20}Se_{80}$ to about $Ge_{43}Se_{57}$, most preferably about $Ge_{40}Se_{60}$. The layer of chalcogenide glass 18 is preferably between about 100 Å and about 1000 Å thick, most preferably about 300 Å thick. Layer 18 need not be a single layer of glass, but may also be comprised of multiple sub-layers of chalcogenide glass having the same or different stoichiometries. This layer of chalcogenide glass 18 is in electrical contact with the underlying electrode 16.

Over the chalcogenide glass layer 18 is a layer of tin-chalcogenide 20, preferably tin selenide ($Sn_{1+/-x}Se$, where x is between about 1 and 0). It is also possible that other chalcogenide materials may be substituted for selenium here, such as sulfur, oxygen, or tellurium. The tin-chalcogenide layer 20 is preferably about 500 Å thick; however, its thickness depends, in part, on the thickness of the underlying chalcogenide glass layer 18. The ratio of the thickness of the tin-chalcogenide layer 20 to that of the underlying chalcogenide glass layer 18 should be between about 5:1 and about 1:1, more preferably about 2.5:1.

Still referring to FIG. 1, a metal layer 22 is provided over the tin-chalcogenide layer 20, with silver (Ag) being preferred as the metal. This metal layer 22 should be about 500 Å thick. This silver (or other metal) layer 22 assists the switching operation of the memory device. Over the metal layer 22 is a second electrode 24. The second electrode 24 can be made of the same material as the first electrode 16, but is not required to be so. In the exemplary embodiment shown in FIG. 1, the second electrode 24 is preferably tungsten (W). The device(s) may be isolated by an insulating layer 26.

Devices constructed according to the embodiments of the invention, particularly those having a tin selenide layer (e.g., layer 20) disposed proximate a chalcogenide glass layer (e.g., layer 18) show improved temperature tolerance.

In accordance with the embodiment shown at FIG. 1, in a completed memory device 100, the tin-chalcogenide layer 20 provides a source of tin selenide, which is incorporated into chalcogenide glass layer 18 at a conditioning step after formation of the memory device 100. Specifically, the conditioning step comprises applying a potential across the memory element structure of the device 100 such that tin selenide from the tin-chalcogenide layer 20 is incorporated into the chalcogenide glass layer 18, thereby forming a conducting channel through the chalcogenide glass layer 18. Movement of silver ions into or out of that conducting channel during subsequent programming forms a conductive pathway, which causes a detectable resistance change across the memory device 100.

In PCRAM devices, a silver-chalcogenide such as silver selenide has been used in place of the illustrated tin-chalcogenide layer 20. When a relatively thick layer of silver is sputtered directly onto silver selenide (as an electrode or a metal layer), it has been found that agglomeration of silver at the silver silver-selenide interface typically occurs. Such agglomeration can cause subsequent processing problems during manufacture of a memory device. Use of a tin-chalcogenide layer 20 instead of a silver-chalcogenide layer in such a position prevents this silver agglomeration and works at least as effectively as silver-chalcogenide has in the prior art in relation to formation of a conducting channel.

Also, use of a tin-chalcogenide layer, such as layer 20 in this and other embodiments of the invention, offers improved temperature stability for the resulting device 100. For example, devices incorporating a tin-chalcogenide layer in accordance with the invention are able to withstand annealing temperatures during processing of 260° C. for 5 minutes; a thermal step which PCRAM devices utilizing a silver-chalcogenide layer cannot withstand.

Figure 2:
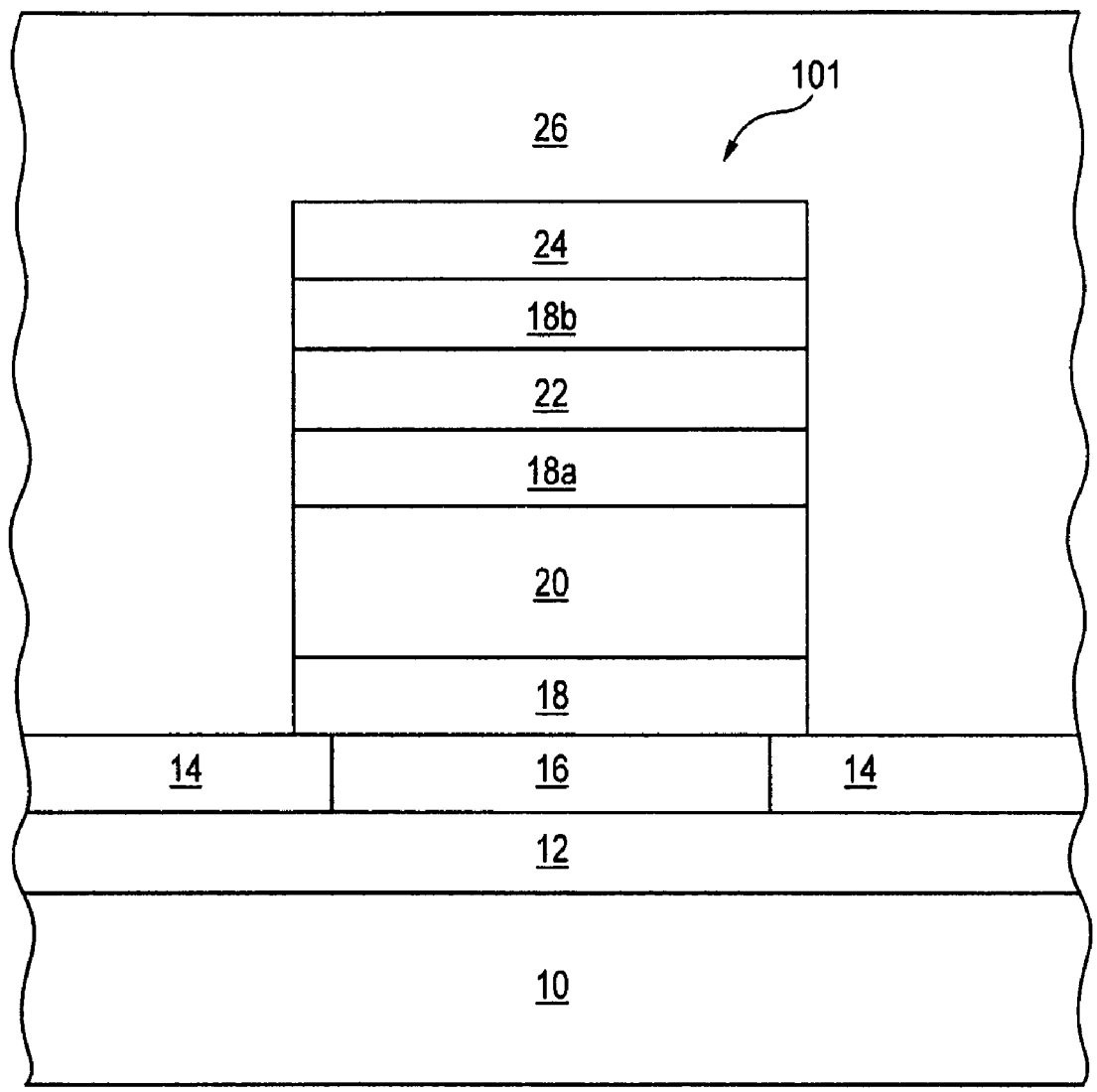

FIG. 2 shows another exemplary embodiment of a memory device 101 constructed in accordance with the invention. Memory device 101 has many similarities to memory device 100 of FIG. 1 and layers designated with like reference numbers are preferably the same materials and have the same thicknesses as those described in relation to the embodiment shown in FIG. 1. The primary difference between device 100 and device 101 is the addition to device 101 of an optional second chalcogenide glass layer 18a and an optional third chalcogenide glass layer 18b.

The optional second chalcogenide glass layer 18a is formed over the tin-chalcogenide layer 20, is preferably $Ge_{40}Se_{60}$, and is preferably about 150 Å thick. Over this optional second chalcogenide glass layer 18a is a metal layer 22, which is preferably silver (Ag) and is preferably about 500 Å thick. Over the metal layer 22 is an optional third chalcogenide glass layer 18b, which is preferably $Ge_{40}Se_{60}$ and is preferably about 100 Å thick. The optional third chalcogenide glass layer 18b provides an adhesion layer for subsequent electrode formation. As with layer 18 of FIG. 1, layers 18a and 18b are not necessarily a single layer, but may be comprised of multiple sub-layers. Additionally, the optional second and third chalcogenide layers 18a and 18b may be a different chalcogenide glass from the first chalcogenide glass layer 18 or from each other. Other chalcogenide glasses that may be useful for this purpose include, but are not limited to, germanium sulfide (GeS), and combination of germanium (Ge), silver (Ag), and selenium (Se).

Over the optional third chalcogenide glass layer 18b is a second electrode 24, which may be any conductive material, except those that will migrate into the stack and alter memory operation (e.g., Cu or Ag), as discussed above for the preceding embodiments. Preferably, the second electrode 24 is tungsten (W).

Figure 3:
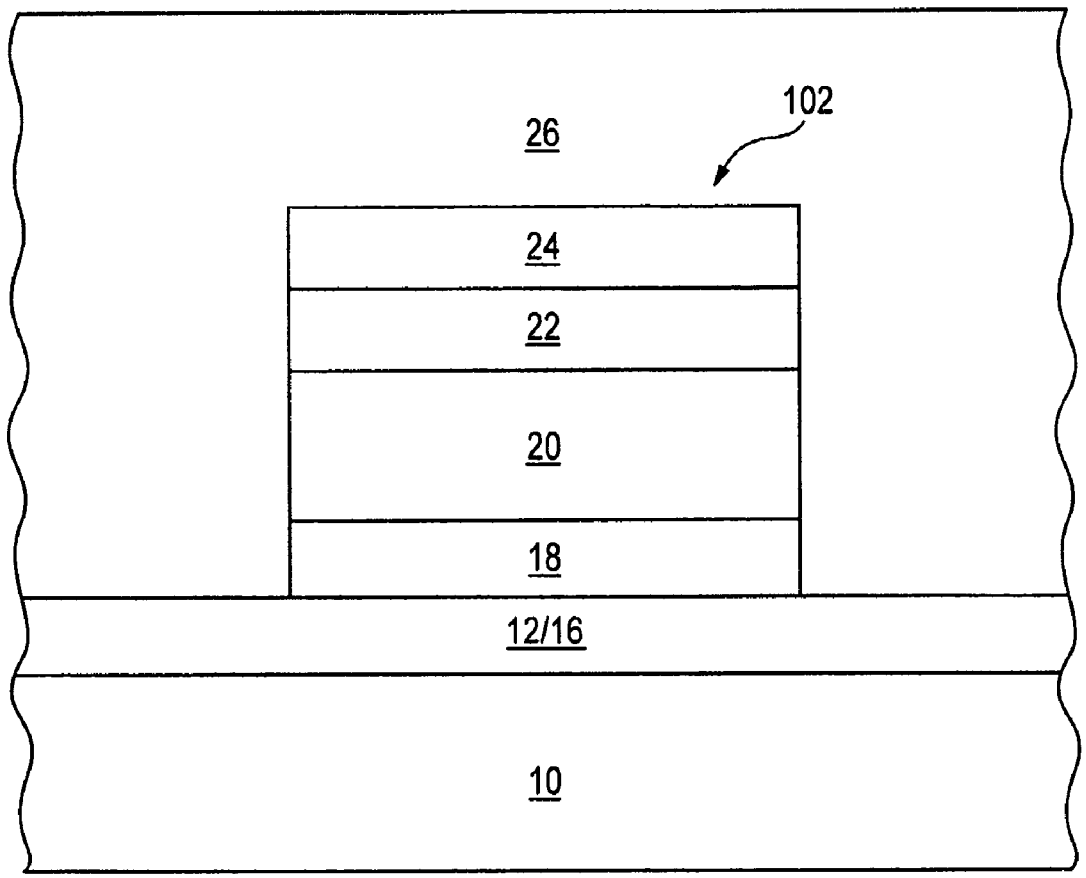

The above-discussed embodiments are exemplary embodiments of the invention; however, other exemplary embodiments as shown in FIGS. 3-10, may be used. FIG. 3 shows an exemplary embodiment (where like reference numbers between figures designate like features) in which the memory device 102 does not incorporate a first electrode 16 separate from an address line 12. The memory device 102 utilizes a combined address line and electrode structure 12/16, thereby allowing the device to be slightly more simple in design and fabricated in fewer steps than with the embodiments shown in FIGS. 1-2. The address line and electrode structure 12/16 may be the same materials as discussed above for the first electrode 16.

Figure 4:
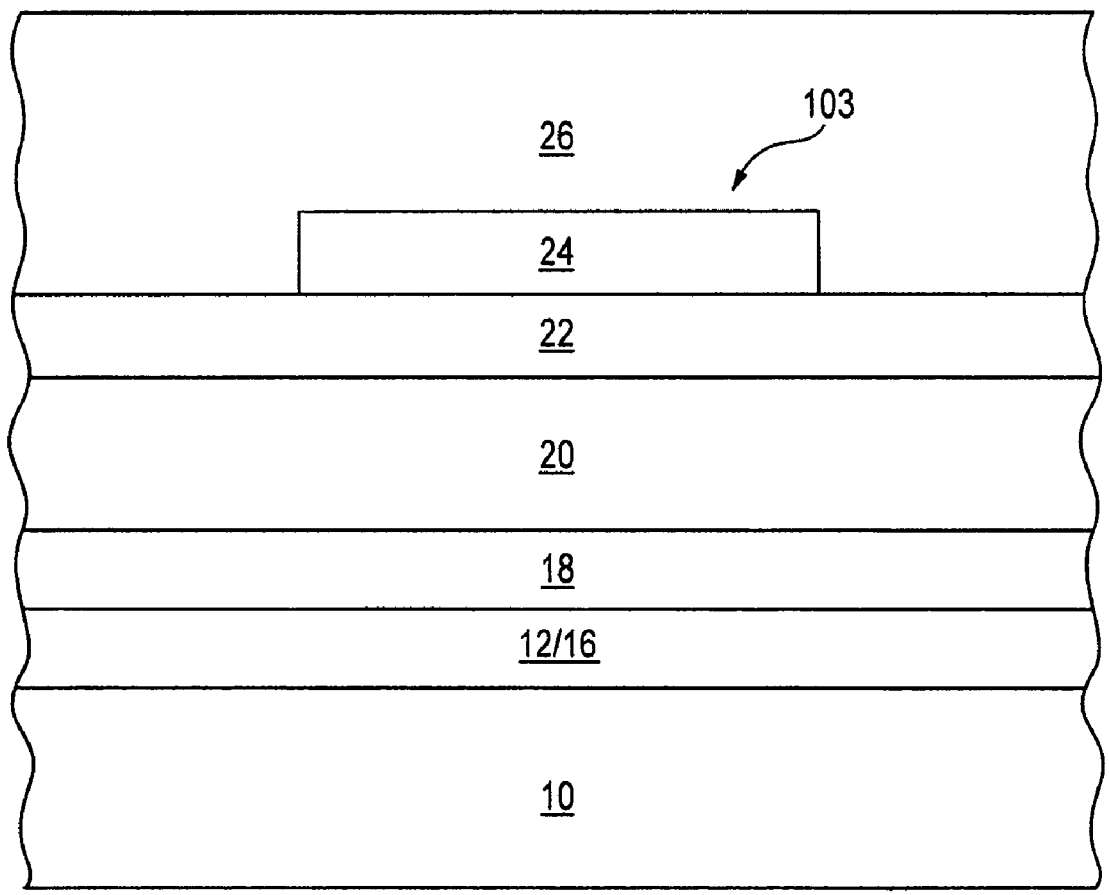

FIG. 4 shows a memory device 103 defined, predominantly, by the position of the second electrode 24. The underlying layers of the memory element, i.e., the chalcogenide glass layer 18, the tin-chalcogenide layer 20, and the metal layer 22, are blanket layers formed over a combined address line and electrode structure 12/16 and substrate 10. Alternatively, a first electrode 16 separate from an underlying address line 12 may be used, as with memory device 100 shown in FIG. 1. The position of the second electrode 24 defines the position of the conducting channel formation at the conditioning step and the conductive pathway during operation of the memory device 103, thus, in this way the second electrode 24 defines the location of the memory device 103.

Figure 5:
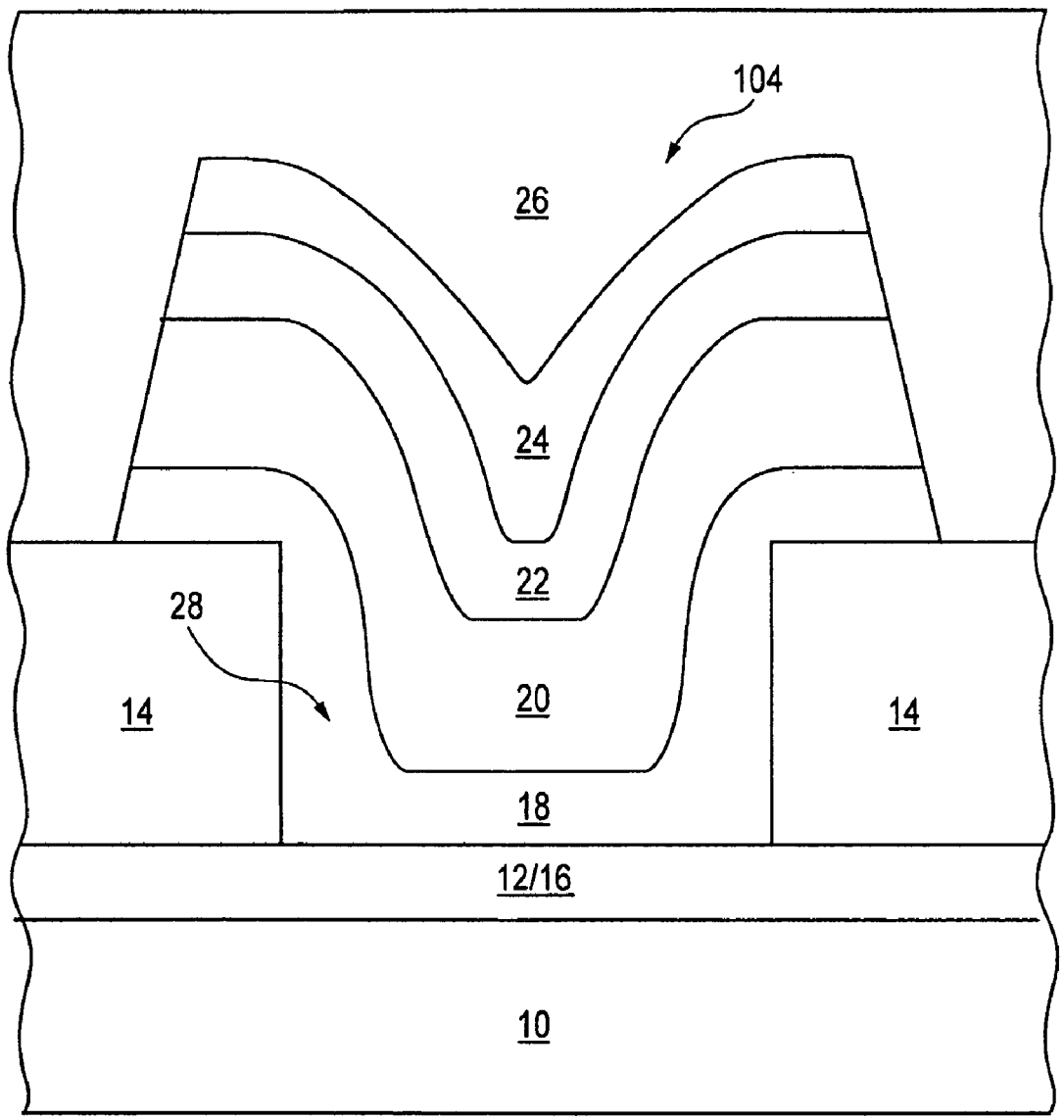

FIG. 5 shows an exemplary embodiment (where like reference numbers between figures designate like features) where the memory element is fabricated in a via 28 formed in an insulating layer 14 over an address line and electrode structure 12/16. The layers of the memory element, i.e., chalcogenide glass layer 18, tin-chalcogenide layer 20, and metal layer 22; as well as the second electrode 24 are conformally deposited over the insulating layer 14 and substrate 10 and within the via 28 over the address line and electrode structure 12/16. The layers 18, 20, 22, and 24 are patterned to define a stack over the via 28, which is etched to form the completed memory device 104. Alternatively, a first electrode 16 may be used which is separate from the underlying address line 12. This separate electrode 16 may also, as another alternative, be formed in the via 28 prior to the formation of the chalcogenide glass layer 18.

Figure 6:
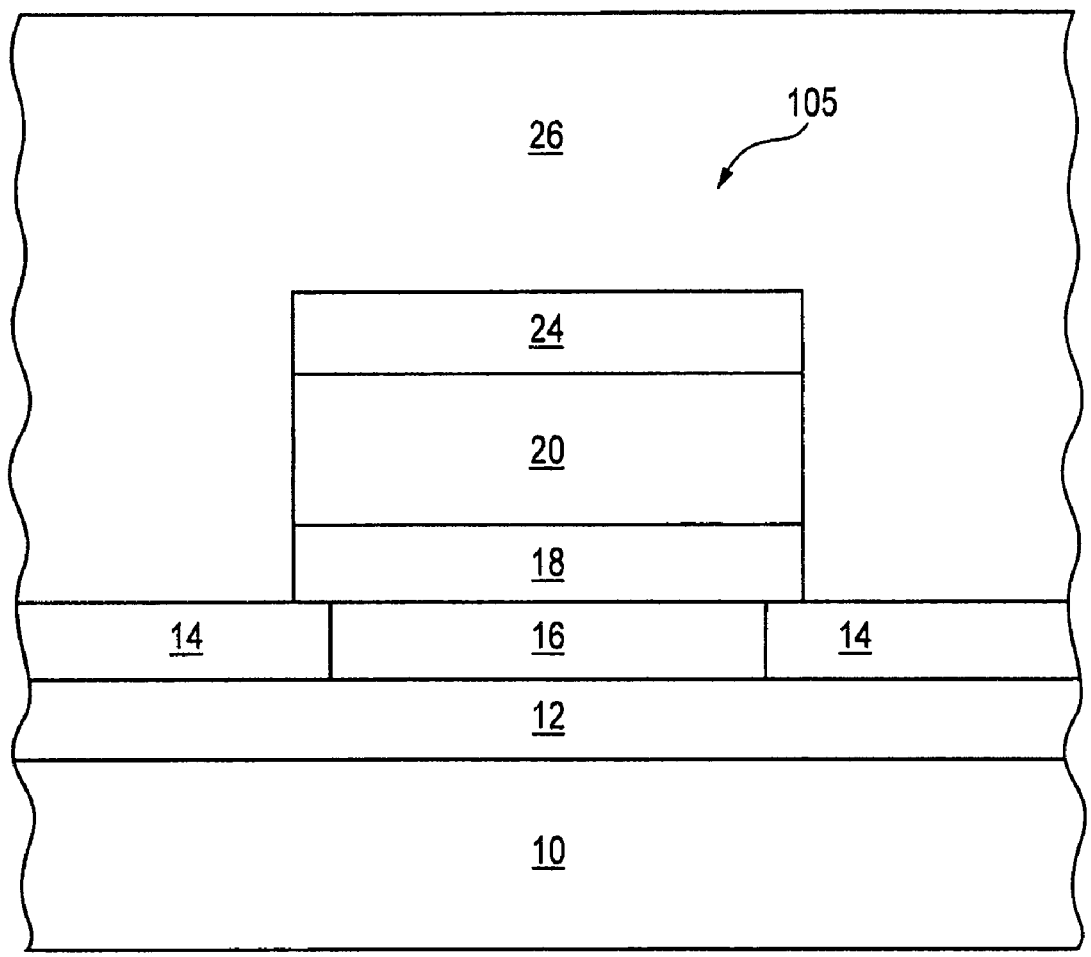

FIG. 6 shows another exemplary embodiment of a memory device 105 constructed in accordance with the invention. Memory device 105 has many similarities to memory device 100 of FIG. 1 and layers designated with like reference numbers are preferably the same materials and have the same dimensions as those described in relation to the embodiment shown in FIG. 1. Device 105 is supported by a substrate 10 and is over an address line 12. The device 105 has a first electrode 16, a chalcogenide glass layer 18 over the first electrode 16, and a tin-chalcogenide layer 20 over the chalcogenide glass layer 18. In this exemplary embodiment, the second electrode 24 is positioned over the tin-chalcogenide layer 20 and contains a metal, such as silver, which would be available for switching the cell from a low to a high conductivity (high to low resistance).

Figure 7:
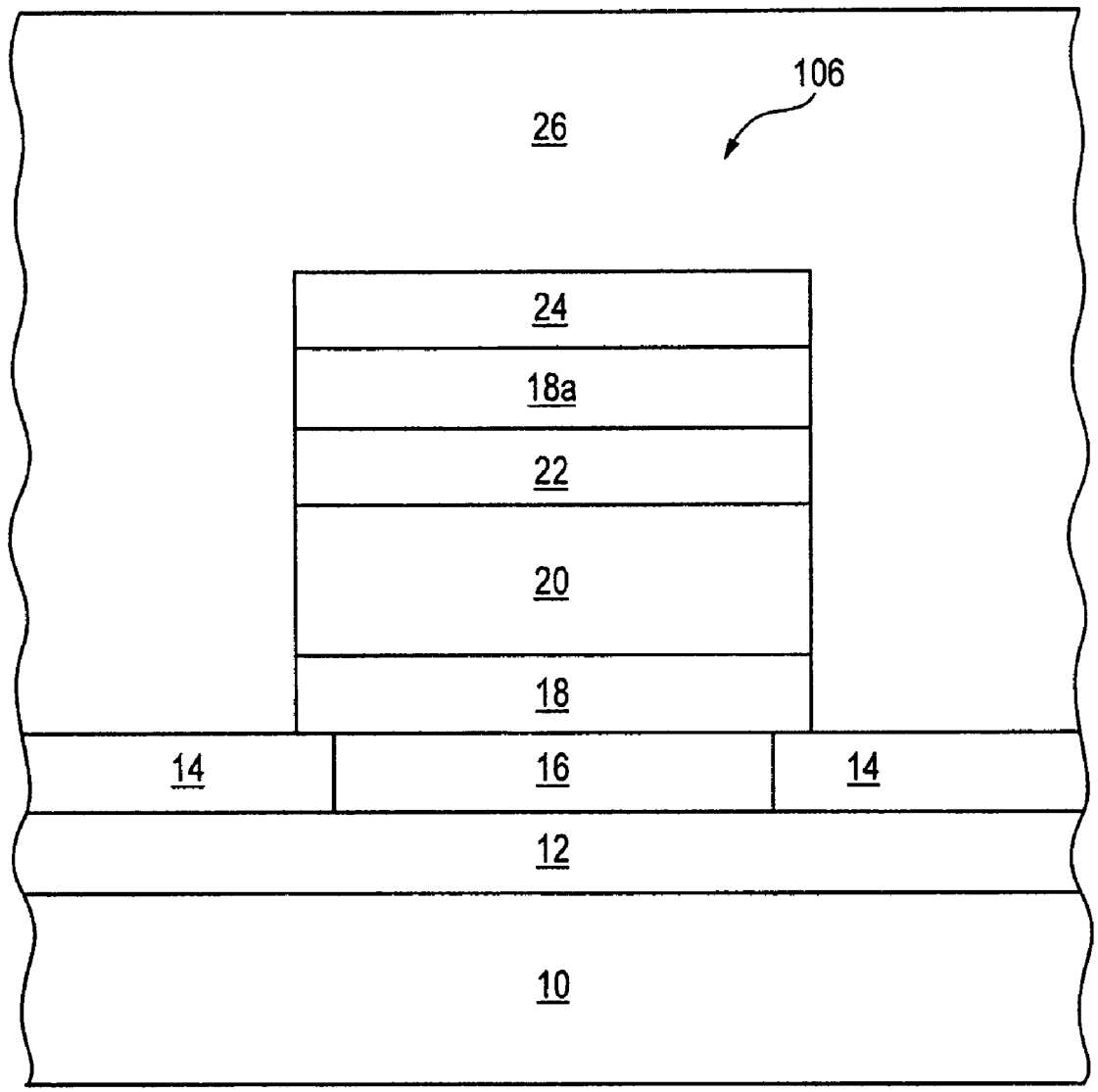

FIG. 7 shows another exemplary embodiment of a memory device 106 constructed in accordance with the invention. Memory device 106 has many similarities to memory device 100 of FIG. 1 and device 101 of FIG. 2 and layers designated with like reference numbers are preferably the same materials and have the same dimensions as those described in relation to the embodiment shown in FIGS. 1 and 2. Device 106 of FIG. 7 is supported by a substrate 10 and is positioned over an address line 12. Device 106 has a first electrode 16, a chalcogenide glass layer 18 over the first electrode, and a tin-chalcogenide layer 20 over the chalcogenide glass layer 18. A metal layer 22, preferably silver, is positioned over the tin-chalcogenide layer 20. Over the metal layer 22 is positioned a second chalcogenide glass layer 18a, which may be the same material as the first chalcogenide glass layer 18. Over the second chalcogenide glass layer 18a is a second electrode 24.

Figure 8:
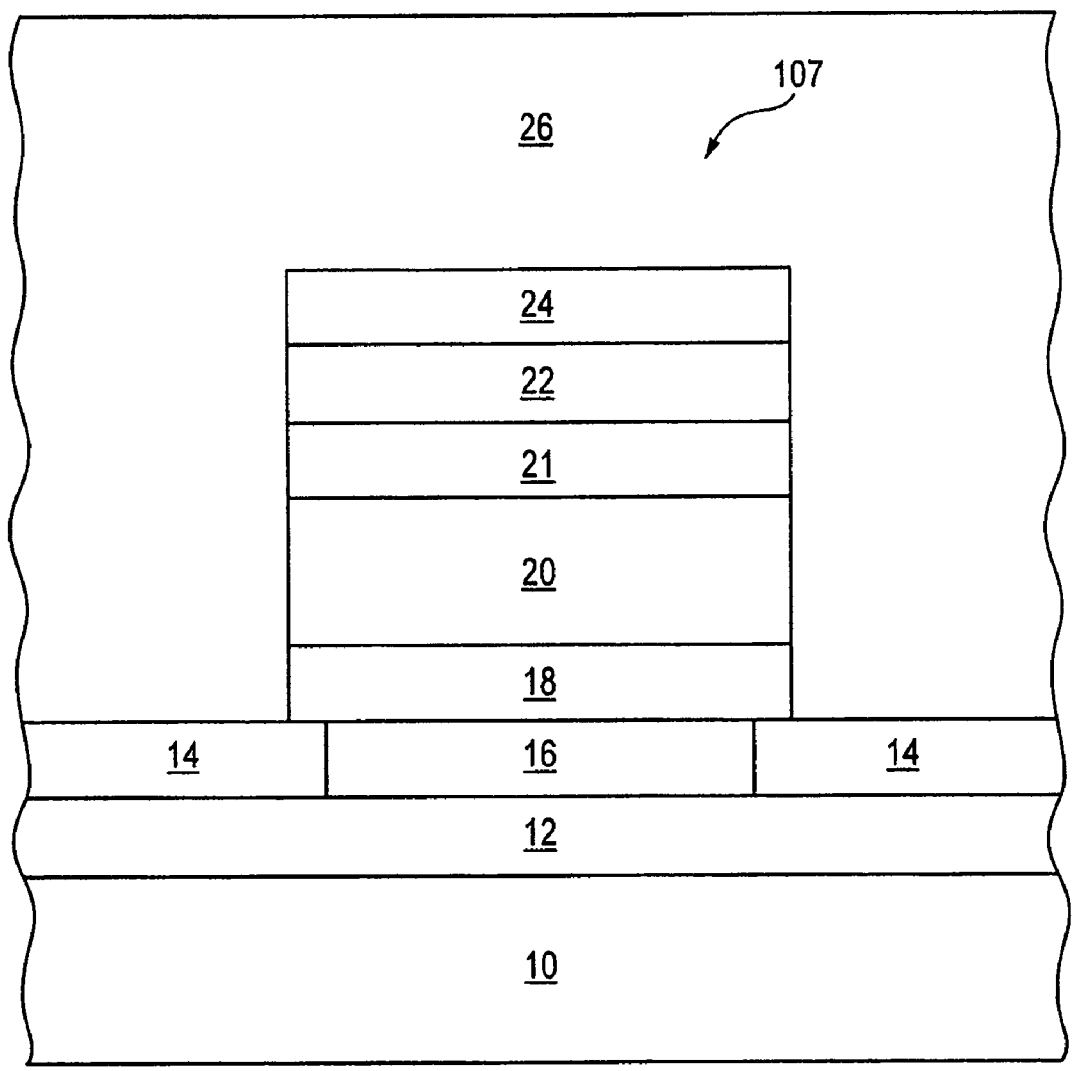

FIG. 8 shows another exemplary embodiment of a memory device 107 constructed in accordance with the invention. Memory device 107 has many similarities to memory device 100 of FIG. 1 and layers designated with like reference numbers are preferably the same materials and have the same dimensions as those described in relation to the embodiment shown in FIG. 1. Device 107 of FIG. 8 is supported by a substrate 10 and is positioned over an address line 12. Device 107 has a first electrode 16, a chalcogenide glass layer 18 over the first electrode, and a tin-chalcogenide layer 20 over the chalcogenide glass layer 18. Over the tin-chalcogenide layer 20 is an alloy-control layer 21, which is preferably selenium (Se) or tin oxide (SnO). The alloy-control layer 21 can be about 100 Å to about 300 Å thick, preferably about 100 Å thick. A metal layer 22, preferably silver, is positioned over the alloy-control layer 21. Over the metal layer 22 is a second electrode 24. The addition of an alloy-control layer 21 (above or below the tin-chalcogenide layer 20) improves the electrical performance of a PCRAM cell.

Excess tin in a PCRAM stack may prohibit the PCRAM cell from switching. This is due, at least in part, to the formation of an Ag/Sn alloy which prevents the Ag from participating in switching. To avoid the formation of excess Sn (or $Sn^{2+}$ or $Sn^{4+}$) which will subsequently impair device performance, a PCRAM stack may be formed with an alloy-control layer 21 of Se or SnO in two different locations: above the tin-chalcogenide layer 20 and below the tin-chalcogenide layer 20. Both of these cases show good electrical switching. However, the best switching is found in devices having a tin-chalcogenide layer 20 of preferred SnSe in direct contact with the chalcogenide glass layer 18 and where the alloy-control layer 21 is above the tin-chalcogenide 20 layer, as shown by FIG. 8.

It is believed that as Sn (or Sn2+ or Sn4+) is freed up during switching (when the Se from the preferred tin-chalcogenide layer 20 goes onto the chalcogenide glass layer 18 structure and creates a conductive pathway) excess Se or SnO from the alloy-control layer 21 interacts with this Sn and prevents it from alloying with Ag or from migrating into the chalcogenide glass layer 18.

Improvements include data retention and possibly cycling, as well as a decrease in the read disturb of the OFF state. The read disturb is the tendency of the device to turn ON after reading multiple times when it is programmed to the OFF state.

Figure 9:
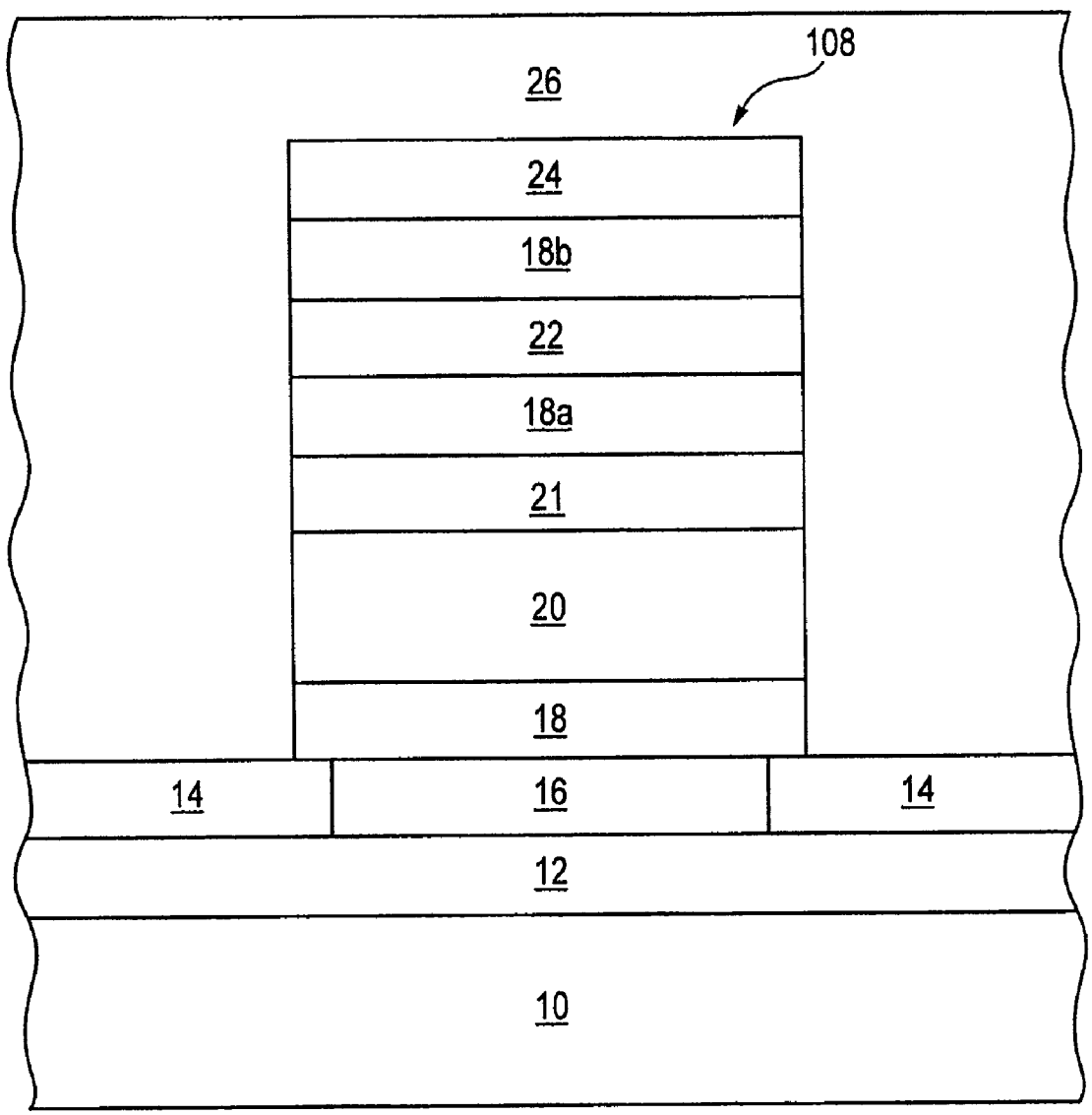

FIG. 9 shows another exemplary embodiment of a memory device 108 constructed in accordance with the invention. Memory device 108 has many similarities to memory device 100 of FIG. 1, device 101 of FIG. 2, and to device 107 of FIG. 8 and layers designated with like reference numbers are preferably the same materials and have the same dimensions as those described in relation to the embodiment shown in FIGS. 1, 2 and 8. Device 108 of FIG. 9 is supported by a substrate 10 and is positioned over an address line 12. Device 108 has a first electrode 16, a chalcogenide glass layer 18 over the first electrode, and a tin-chalcogenide layer 20 over the chalcogenide glass layer 18. An alloy-control layer 21 is provided over the tin-chalcogenide layer 20. Over the alloy-control layer 21 is positioned a second chalcogenide glass layer 18a, which may be the same material as the first chalcogenide glass layer 18. A metal layer 22, preferably silver, is positioned over the second chalcogenide glass layer 18a. Over the metal layer 22, is a third chalcogenide glass layer 18b, which may be the same material as the first two chalcogenide glass layers 18 and 18b. Over the third chalcogenide glass layer 18b is a second electrode 24.

Figure 10:
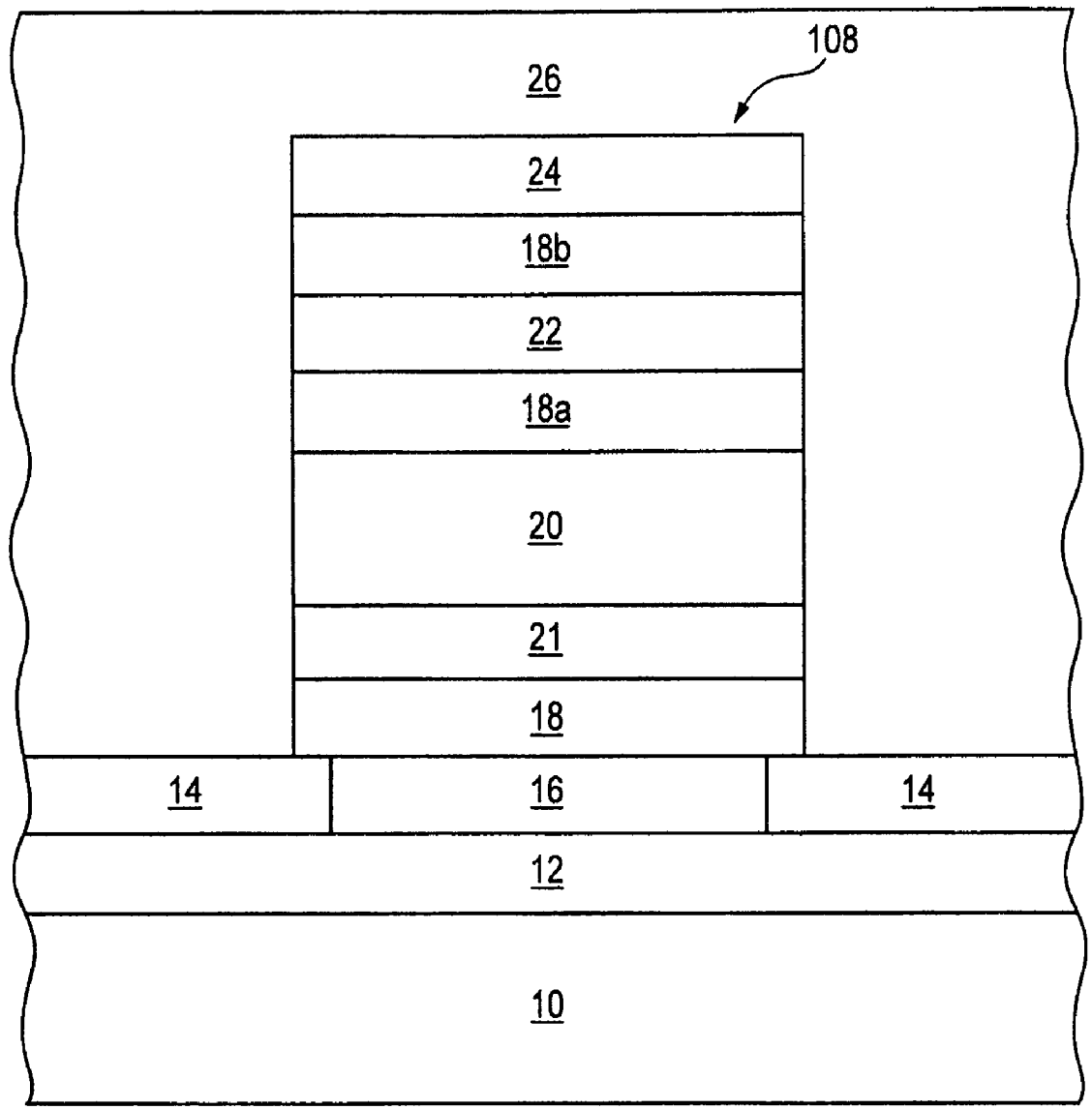

FIG. 10 shows another exemplary embodiment of a memory device 109 constructed in accordance with the invention. Memory device 109 has many similarities to memory device 100 of FIG. 1, device 101 of FIG. 2, device 107 of FIG. 8, and to device 108 of FIG. 9 and layers designated with like reference numbers are preferably the same materials and have the same dimensions as those described in relation to the embodiment shown in FIGS. 1, 2, 8 and 9. Device 109 of FIG. 10 is supported by a substrate 10 and is positioned over an address line 12. Device 108 has a first electrode 16 and a chalcogenide glass layer 18 over the first electrode. An alloy-control layer 21 is provided over the chalcogenide glass layer 18. A tin-chalcogenide layer 20 is over the alloy-control layer 21. Over the tin-chalcogenide layer 20 is positioned a second chalcogenide glass layer 18a, which may be the same material as the first chalcogenide glass layer 18. A metal layer 22, preferably silver, is positioned over the second chalcogenide glass layer 18a. Over the metal layer 22, is a third chalcogenide glass layer 18b, which may be the same material as the first two chalcogenide glass layers 18 and 18b. Over the third chalcogenide glass layer 18b is a second electrode 24.

FIGS. 11-14 illustrate a cross-sectional view of a wafer during the fabrication of a memory device 100 as shown by FIG. 1. Although the processing steps shown in FIGS. 11-14 most specifically refer to memory device 100 of FIG. 1, the methods and techniques discussed may also be used to fabricate memory devices 101-109 as would be understood by a person of ordinary skill in the art based on a reading of this specification.

Figure 11:
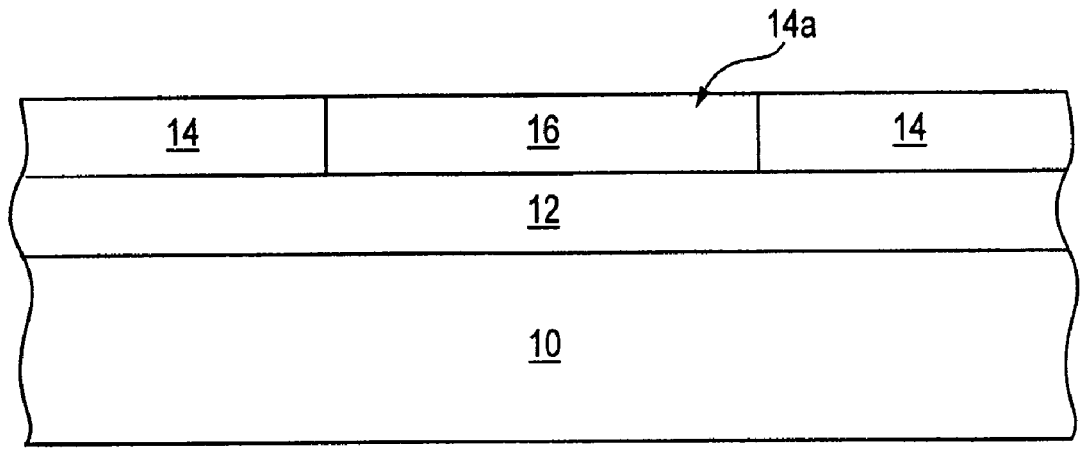
FIGS. 11-14 illustrate exemplary sequential stages of processing during the fabrication of a memory device of FIG. 1 in accordance with the invention.

As shown by FIG. 11, a substrate 10 is provided. As indicated above, the substrate 10 can be semiconductor-based or another material useful as a supporting structure as is known in the art. If desired, an optional insulating layer (not shown) may be formed over the substrate 10; the optional insulating layer may be silicon nitride or other insulating materials used in the art. Over the substrate 10 (or optional insulating layer, if desired), a conductive address line 12 is formed by depositing a conductive material such as doped polysilicon, aluminum, platinum, silver, gold, nickel, but preferably tungsten, patterning one or more conductive lines, for instance with photolithographic techniques, and etching to define the address line 12. The conductive material may be deposited by any technique known in the art, such as sputtering, chemical vapor deposition, plasma enhanced chemical vapor deposition, evaporation, or plating.

Still referring to FIG. 11, over the address line 12 is formed an insulating layer 14. This layer 14 can be silicon nitride, a low dielectric constant material, or many other insulators known in the art that do not allow silver ion migration, and may be deposited by any method known in the art. An opening 14a in the insulating layer is made, for instance by photolithographic and etching techniques, thereby exposing a portion of the underlying address line 12. Over the insulating layer 14, within the opening 14a, and over the address line 12 is formed a conductive material, preferably tungsten (W). A chemical mechanical polishing step may then be utilized to remove the conductive material from over the insulating layer 14, to leave it as a first electrode 16 over the address line 12, and planarize the wafer.

Figure 12:
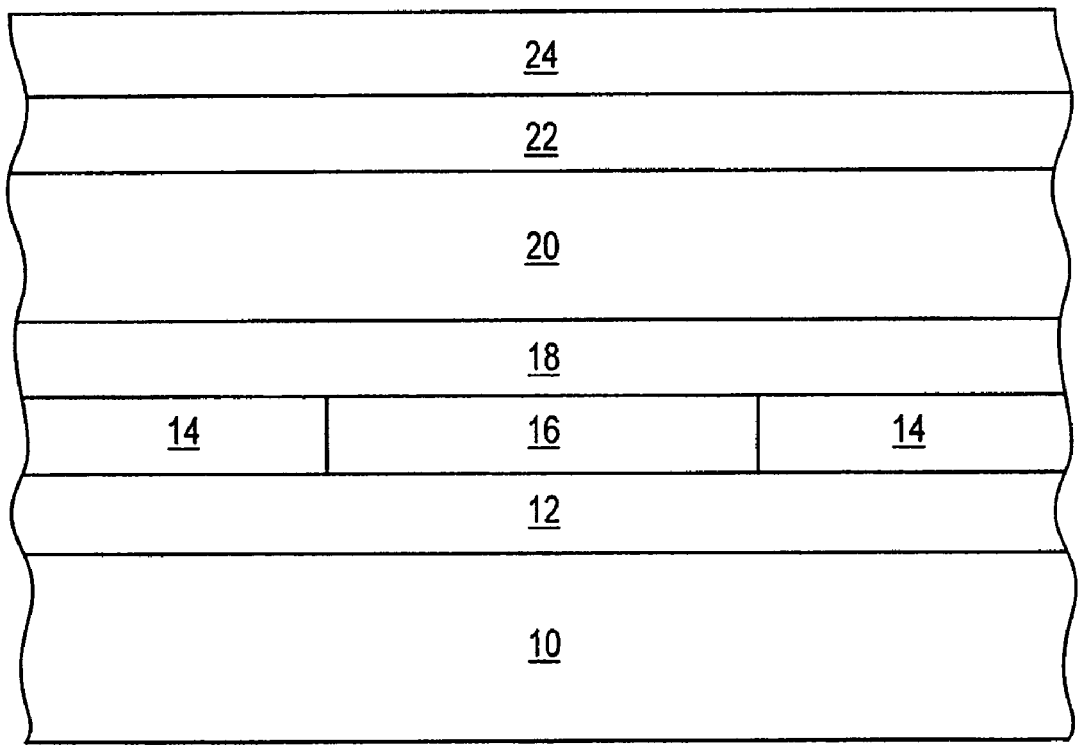

FIG. 12 shows the cross-section of the wafer of FIG. 11 at a subsequent stage of processing. A series of layers making up the memory device 100 (FIG. 1) are blanket-deposited over the wafer. A chalcogenide glass layer 18 is formed to a preferred thickness of about 300 Å over the first electrode 16 and insulating layer 14. The chalcogenide glass layer 18 is preferably $Ge_{40}Se_{60}$. Deposition of this chalcogenide glass layer 18 may be accomplished by any suitable method, such as evaporative techniques or chemical vapor deposition using germanium tetrahydride ($GeH_4$) and selenium dihydride ($SeH_2$) gases; however, the preferred technique utilizes either sputtering from a germanium selenide target having the desired stoichiometry or co-sputtering germanium and selenium in the appropriate ratios.

Still referring to FIG. 12, a tin-chalcogenide layer 20 is formed over the chalcogenide glass layer 18. The tin-chalcogenide layer 20 is preferably tin selenide ($Sn_{1+/-x}Se$, x being between about 1 and 0). Physical vapor deposition, chemical vapor deposition, co-evaporation, sputtering, or other techniques known in the art may be used to deposit layer 20 to a preferred thickness of about 500 Å. Again, the thickness of layer 20 is selected based, in part, on the thickness of layer 18 and the ratio of the thickness of the tin-chalcogenide layer 20 to that of the underlying chalcogenide glass layer 18 is preferably from about 5:1 to about 1:1, more preferably about 2.5:1. It should be noted that, as the processing steps outlined in relation to FIGS. 11-14 may be adapted for the formation of devices in accordance with those shown in FIGS. 2-10, an alloy-control layer 21 as shown in devices 107-109 may be formed adjacent to the tin-chalcogenide layer 20, on either side thereof.

Still referring to FIG. 12, a metal layer 22 is formed over the tin-chalcogenide layer 20. The metal layer 22 is preferably silver (Ag), or at least contains silver, and is formed to a preferred thickness of about 300 Å. The metal layer 22 may be deposited by any technique known in the art.

Still referring to FIG. 12, over the metal layer 22, a conductive material is deposited for a second electrode 24. Again, this conductive material may be any material suitable for a conductive electrode, but is preferably tungsten; however other materials may be used such as titanium nitride or tantalum, for example.

Figure 13:
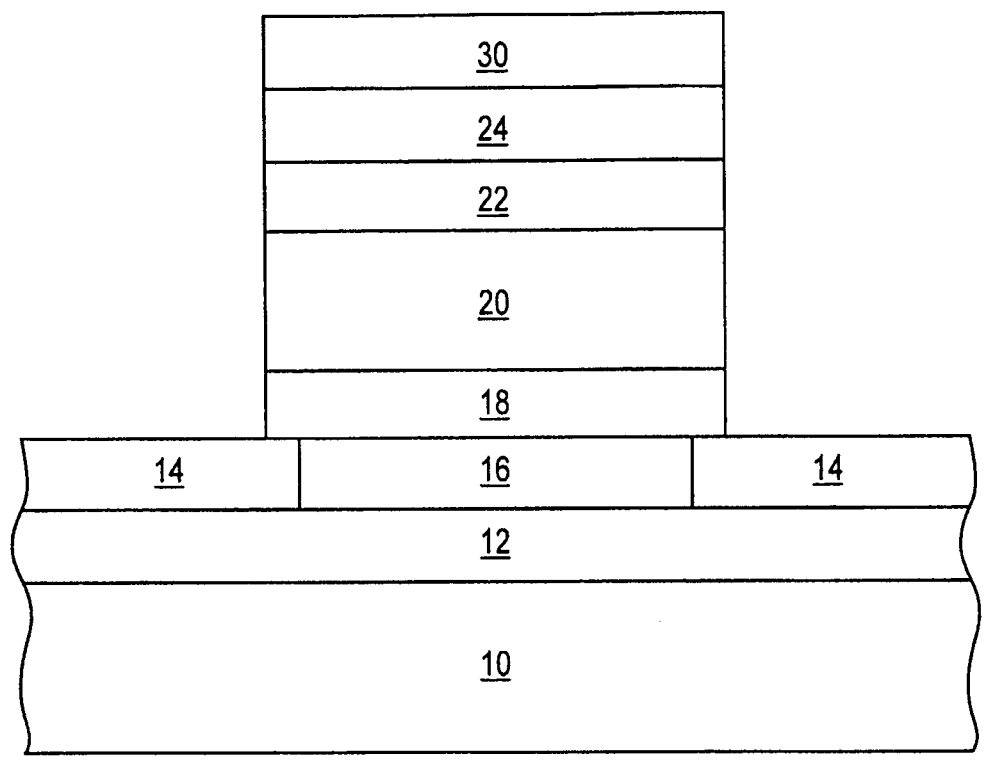
Figure 14:
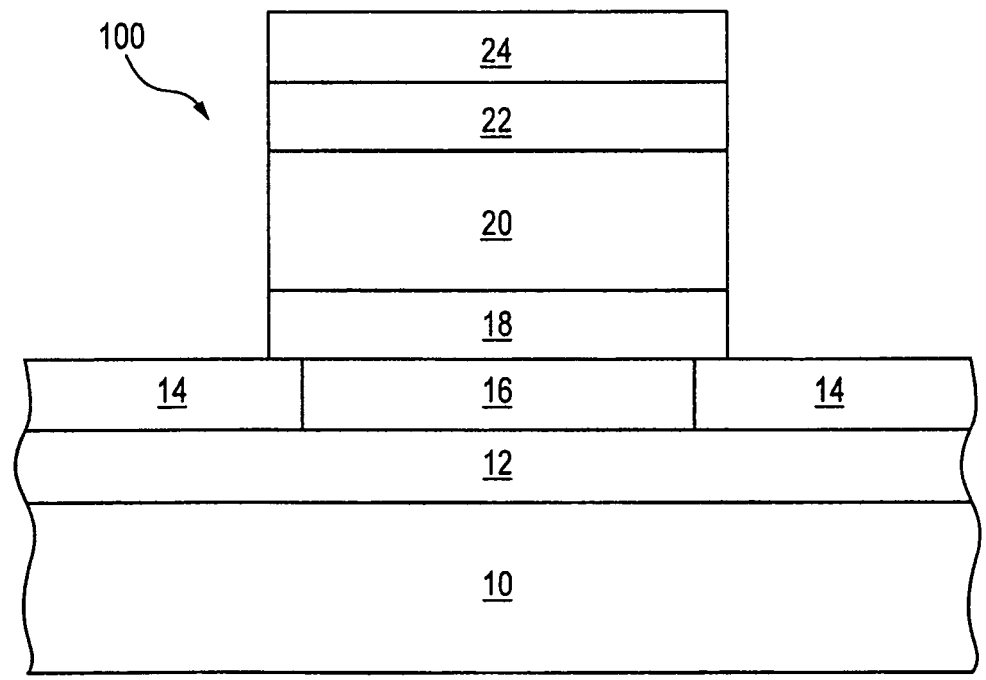

Now referring to FIG. 13, a layer of photoresist 30 is deposited over the top electrode 24 layer, masked and patterned to define the stacks for the memory device 100, which is but one of a plurality of like memory devices of a memory array. An etching step is used to remove portions of layers 18, 20, 22, and 24, with the insulating layer 14 used as an etch stop, leaving stacks as shown in FIG. 13. Then, the photoresist 30 is removed, leaving a substantially complete memory device 100, as shown by FIG. 14. An insulating layer 26 may be formed over the device 100 to achieve a structure as shown by FIG. 1. This isolation step can be followed by the forming of connections to other circuitry of the integrated circuit (e.g., logic circuitry, sense amplifiers, etc.) of which the memory device 100 is a part, as is known in the art.

A conditioning step is performed by applying a voltage pulse of a given duration and magnitude to incorporate material from the tin-chalcogenide layer 20 into the chalcogenide glass layer 18 to form a conducting channel in the chalcogenide glass layer 18. The conducting channel will support a conductive pathway during operation of the memory device 100.

The embodiments described above refer to the formation of only a few possible resistance variable memory device structures (e.g., PCRAM) in accordance with the invention, which may be part of a memory array. It must be understood, however, that the invention contemplates the formation of other memory structures within the spirit of the invention, which can be fabricated as a memory array and operated with memory element access circuits.

Figure 15:
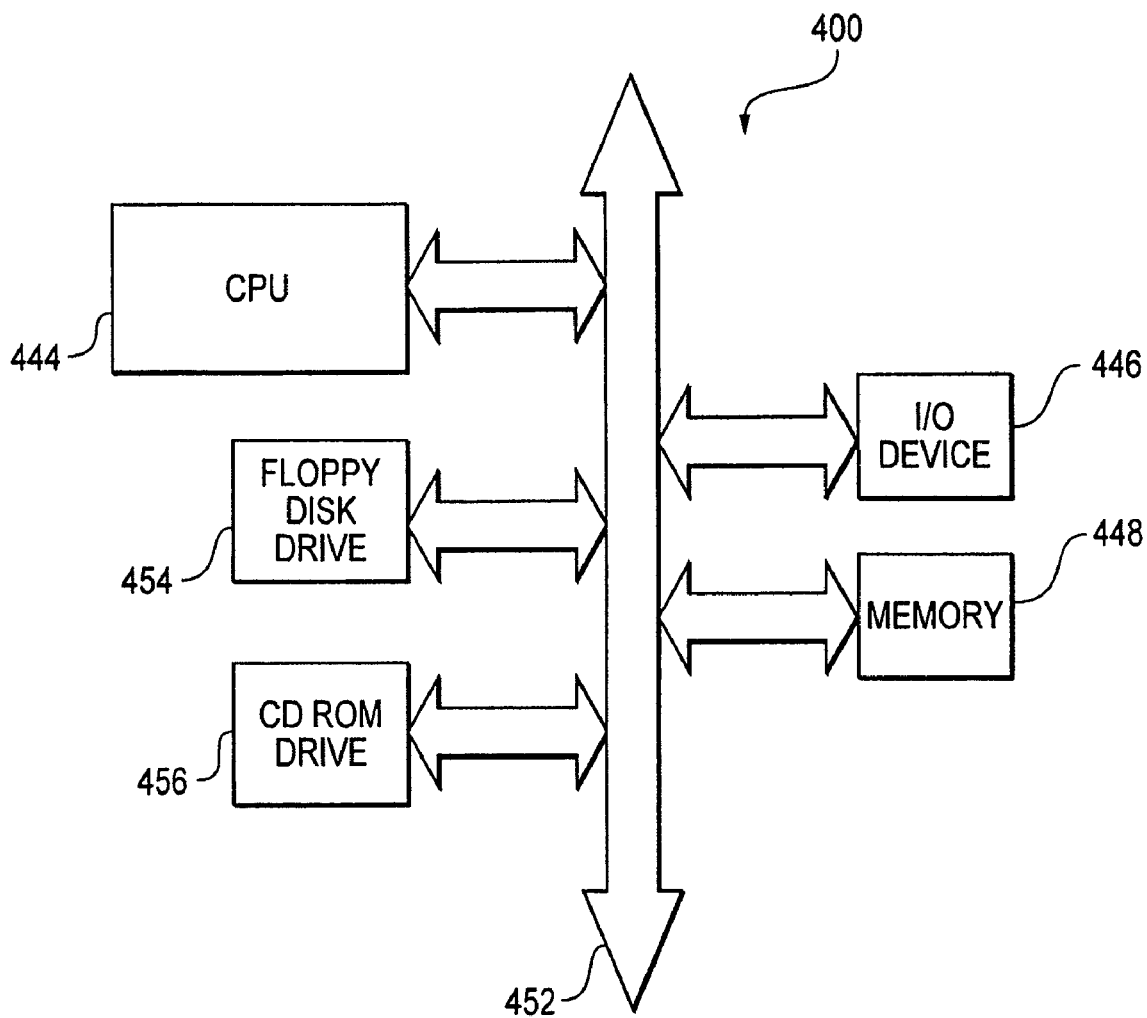
FIG. 15 shows an exemplary processor-based system incorporating memory devices in accordance with the invention.

FIG. 15 illustrates a typical processor system 400 which includes a memory circuit 448, e.g., a PCRAM device, which employs resistance variable memory devices (e.g., device 100-109) fabricated in accordance with the invention. A processor system, such as a computer system, generally comprises a central processing unit (CPU) 444, such as a microprocessor, a digital signal processor, or other programmable digital logic devices, which communicates with an input/output (I/O) device 446 over a bus 452. The memory circuit 448 communicates with the CPU 444 over bus 452 typically through a memory controller.

In the case of a computer system, the processor system may include peripheral devices such as a floppy disk drive 454 and a compact disc (CD) ROM drive 456, which also communicate with CPU 444 over the bus 452. Memory circuit 448 is preferably constructed as an integrated circuit, which includes one or more resistance variable memory devices, e.g., device 100. If desired, the memory circuit 448 may be combined with the processor, for example CPU 444, in a single integrated circuit.

FIGS. 16*a*-17*b* are graphs relating to experimental results obtained from experiments with actual devices having a structure in accordance with the exemplary embodiment shown in FIG. 2. The devices tested have a tungsten bottom electrode (e.g., layer 16), a first 300 Å layer of $Ge_{40}Se_{60}$ (e.g., layer 18) over the bottom electrode, 500 Å layer of SnSe (e.g., layer 20) over the $Ge_{40}Se_{60}$ layer, a second 150 Å layer of $Ge_{40}Se_{60}$ (e.g., layer 18*a*) over the SnSe layer, a 500 Å layer of silver (Ag) (e.g., layer 22) over the second layer of $Ge_{40}Se_{60}$, a third 100 Å layer of $Ge_{40}Se_{60}$ (e.g., layer 18*b*) over the silver layer, and a tungsten top electrode (e.g., layer 24). The experiments on these devices were performed using electrical probing to operate each device. A first probe was placed at the top electrode (e.g., layer 24) and a second probe was placed at the bottom electrode (e.g., layer 16). Potentials were applied between the two probes. These tested devices exhibited improved thermal characteristics relative to previous PCRAM devices. For example, the array exhibited at least a 90% yield in operational memory devices when processing included an anneal at a temperature of 260° C. for 5 minutes. Ninety percent yield refers to the percentage of functional devices out of the total number measured. Out of every 100 devices measured, about 90 were functional memory devices at room temperature without an anneal and about 90 out of 100 worked after a 260° C. anneal. Thus, statistically, there is no change in the total number of functional devices post-anneal.

Figure 16A:
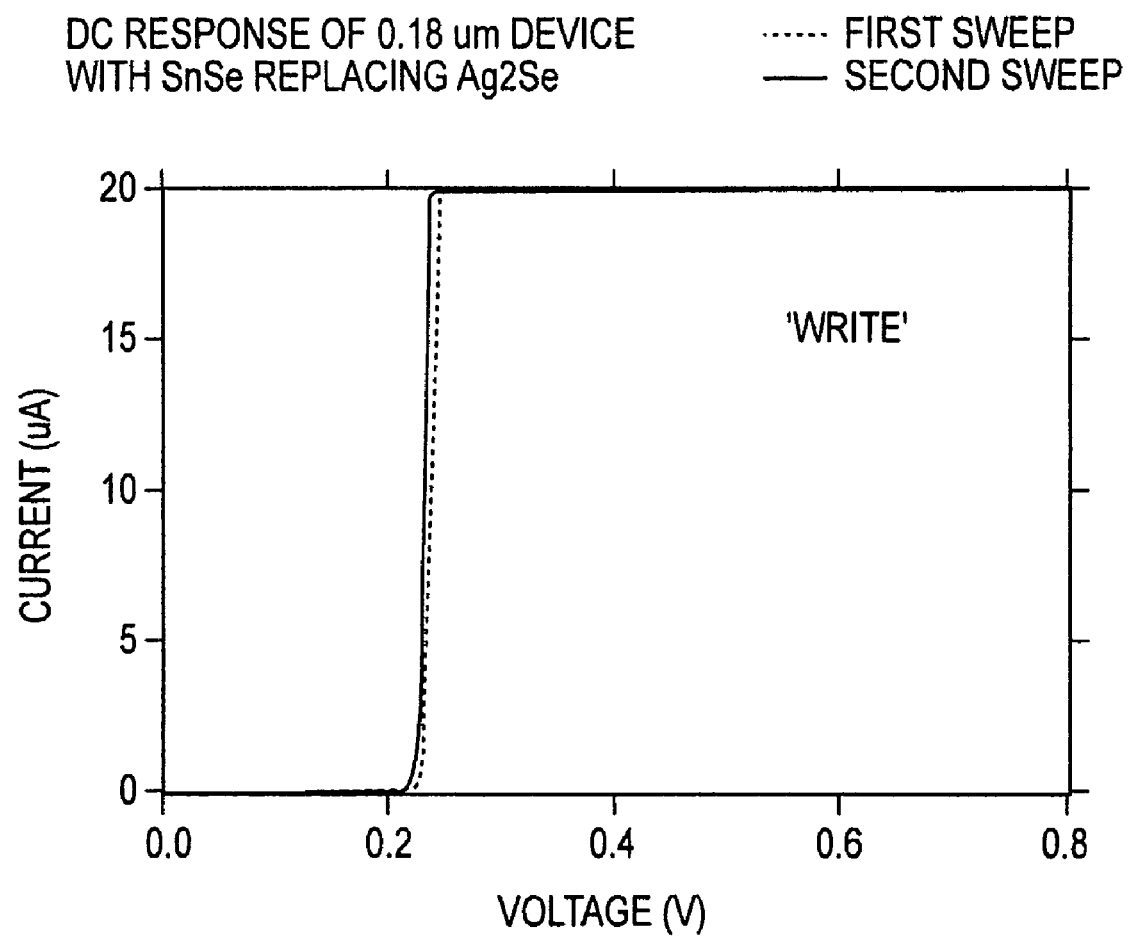
FIGS. 16*a*, 16*b*, 17*a*, and 17*b* are graphs showing exemplary operating parameters of a memory device in accordance with the invention.
Figure 16B:
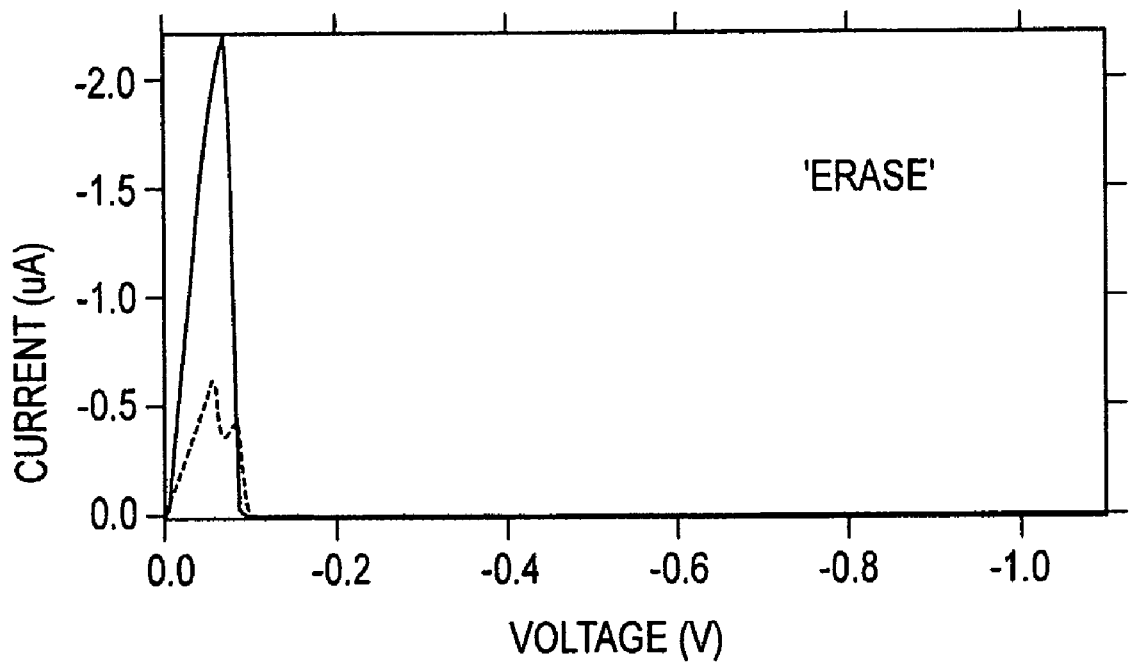

The graphs of FIGS. 16*a* and 16*b* show how the device switches in response to a DC voltage sweep. FIG. 16*a* is a DC switching I-V (current vs. voltage) trace, which shows that the devices tested switched from a less conductive state to a higher conductive state at about 0.2 V during a write voltage sweep. FIG. 16*b* shows a DC switching I-V trace, which shows that the devices erased, or switched from a higher conductive state to a lower conductive state, at about −0.5 V and using less than 3 micro-amps of current during a DC voltage sweep.

Figure 17A:
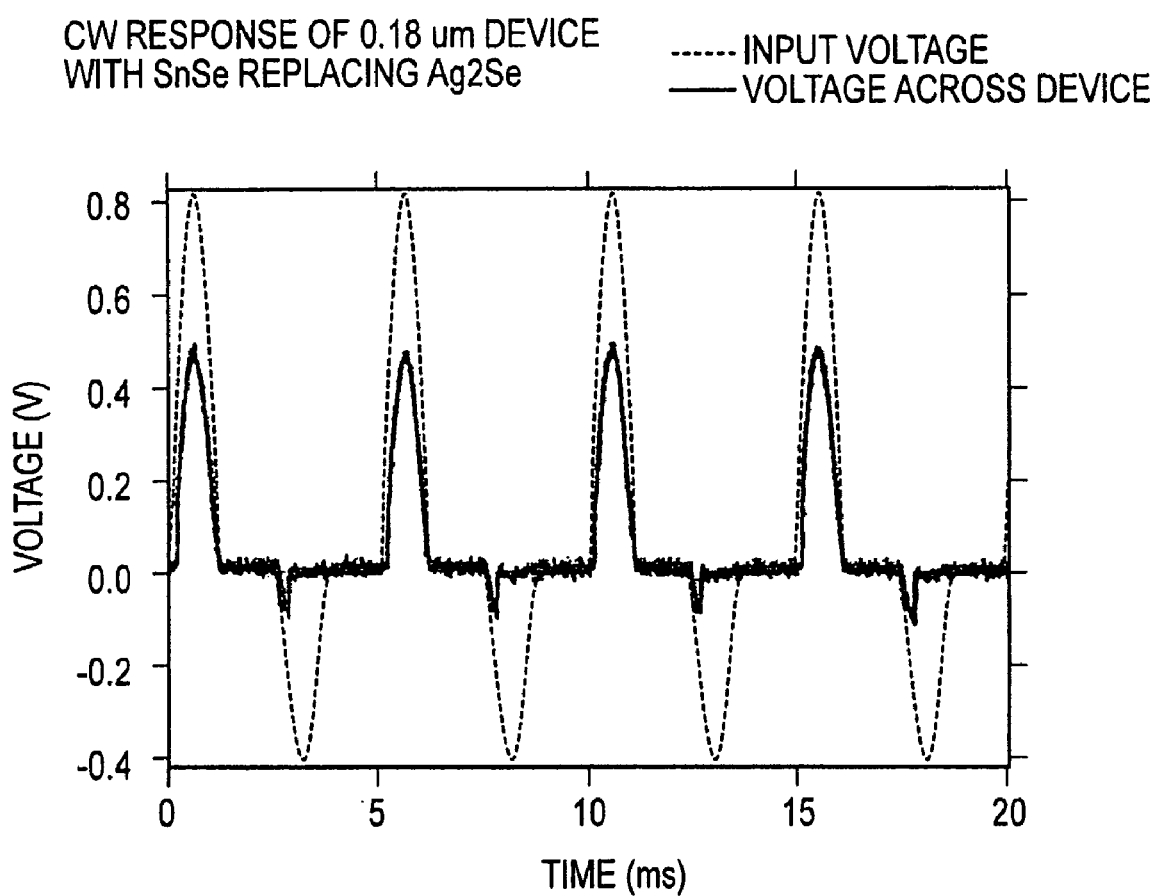
Figure 17B:
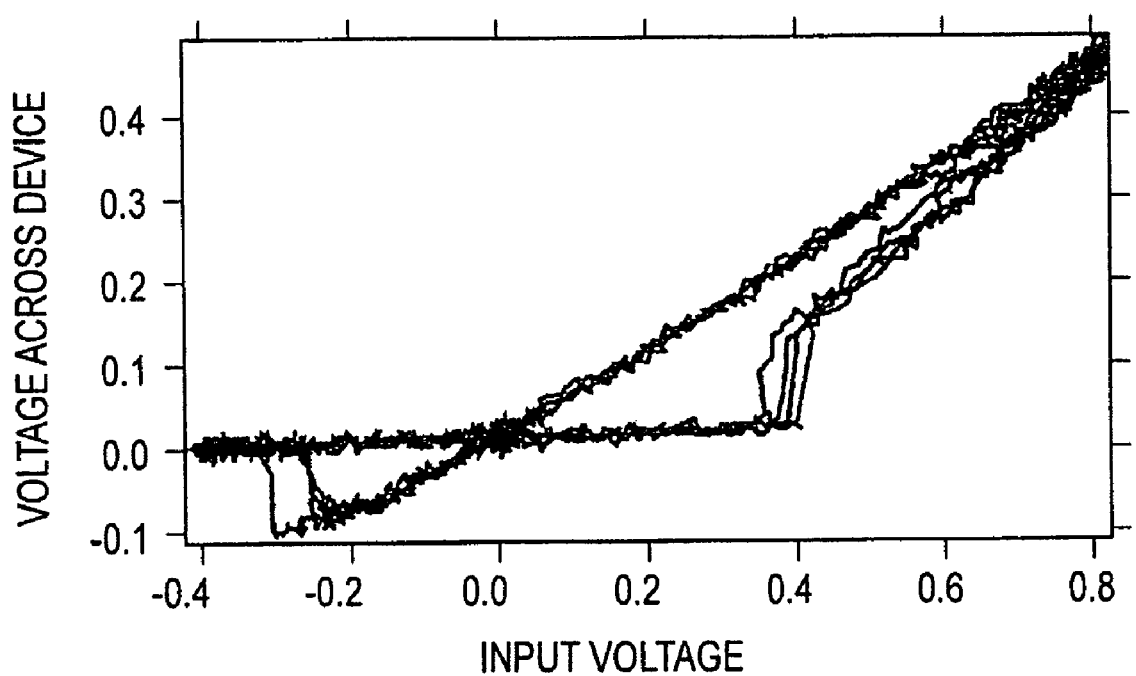

The graph of FIG. 17*a* is a continuous wave device response voltage vs. time trace, which shows how the tested device responds to a continuous wave signal across the device. On the positive voltage side, the device is programmed to its lower resistance state and "follows" the input signal. On the negative voltage side, the device "follows" the input signal until the device erases, or is programmed, to a higher resistance state. FIG. 17*b* is a graph relating the voltage across the memory device to the input voltage. As shown, the "threshold voltage" in this example is about 0.4 V to switch the device to its more conductive state and about −0.3 V to switch the device to its less conductive state.

The above description and drawings should only be considered illustrative of exemplary embodiments that achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A memory device comprising:
    a combined address line and electrode structure;
    a second electrode;
    a chalcogenide glass material between the combined address line and electrode structure and the second electrode;
    a material comprising tin selenide between the chalcogenide glass material and the second electrode; and
    a metal-containing material between the combined address line and electrode structure and the second electrode.

2. The memory device of claim 1, wherein the chalcogenide glass material comprises germanium selenide.

3. The memory device of claim 1, wherein at least one of the second electrode and the combined address line and electrode structure comprises tungsten.

4. The memory device of claim 1, further comprising:
    a second chalcogenide glass material between the tin selenide material and the second electrode; and a third chalcogenide glass material between the metal-containing material and the second electrode.

5. The memory device of claim 1, wherein the chalcogenide glass material comprises a conducting channel.

6. The memory device of claim 1, further comprising an alloy-control material that is between the chalcogenide glass material and the second electrode.

7. The memory device of claim 6, wherein the alloy-control material comprises at least one of selenium and tin oxide.

8. A memory device comprising:
a combined address line and electrode structure blanket layer;
a second electrode;
a chalcogenide glass blanket layer between the combined address line and electrode structure blanket layer and the second electrode; and
a blanket layer comprising tin selenide between the chalcogenide glass blanket layer and the second electrode.

9. The memory device of claim 8, wherein at least one of the second electrode and the combined address line and electrode structure blanket layer comprises tungsten.

10. The memory device of claim 8, further comprising:
a second chalcogenide glass blanket layer between the tin selenide blanket layer and the second electrode;
a metal-containing blanket layer between the second chalcogenide glass blanket layer and the second electrode; and
a third chalcogenide glass blanket layer between the metal-containing blanket layer and the second electrode.

11. The memory device of claim 8, wherein the chalcogenide glass blanket layer comprises a conducting channel.

12. The memory device of claim 8, wherein the chalcogenide glass blanket layer comprises germanium selenide.

13. The memory device of claim 8, further comprising an alloy-control blanket layer that is between the chalcogenide glass blanket layer and the second electrode.

14. The memory device of claim 13, wherein the alloy-control blanket layer material comprises at least one of selenium and tin oxide.

15. A resistance variable memory device comprising:
a first electrode;
a second electrode;
a chalcogenide glass region between the first electrode and the second electrode;
a region comprising tin selenide between the chalcogenide glass region and the second electrode;
an alloy-control region between the chalcogenide glass region and the second electrode.

16. The resistance variable memory device of claim 15, wherein the chalcogenide glass region comprises germanium selenide.

17. The resistance variable memory device of claim 15, wherein at least one of the first and second electrodes comprises tungsten.

18. The resistance variable memory device of claim 15, further comprising:
a second chalcogenide glass region between the tin selenide region and the second electrode;
a metal-containing region between the second chalcogenide glass region and the second electrode; and
a third chalcogenide glass region between the metal-containing region and the second electrode.

19. The resistance variable memory device of claim 15, wherein the alloy-control region material comprises at least one of selenium and tin oxide.

20. The resistance variable memory device of claim 15, wherein the chalcogenide glass region comprises a conducting channel.

21. A resistance variable memory device comprising:
a first electrode;
a second electrode;
a first chalcogenide glass region between the first electrode and the second electrode;
a second chalcogenide glass region between the first electrode and the second electrode;
a region comprising tin selenide between the first chalcogenide glass region and the second electrode; and
a metal-containing region between the first electrode and the second electrode.

22. The resistance variable memory device of claim 21, wherein at least one of the first and second chalcogenide glass regions comprises germanium selenide.

23. The resistance variable memory device of claim 21, wherein at least one of the first and second electrodes comprises tungsten.

24. The resistance variable memory device of claim 21, further comprising a third chalcogenide glass region between the metal-containing region and the second electrode.

25. The resistance variable memory device of claim 21, further comprising an alloy-control region that is between the first chalcogenide glass region and the second electrode.

26. The resistance variable memory device of claim 25, wherein the alloy control region material comprises at least one of selenium and tin oxide.

27. A memory device comprising:
a combined address line and electrode structure;
a second electrode;
a chalcogenide glass material between the combined address line and electrode structure and the second electrode;
a material comprising tin selenide between the chalcogenide glass material and the second electrode.

28. The memory device of claim 27 wherein the combined address line and electrode structure comprises tungsten.

29. The memory device of claim 27 wherein the chalcogenide glass material comprises $Ge_{40}Se_{60}$.

30. The memory device of claim 27 wherein the second electrode comprises tungsten.

31. The memory device of claim 27 wherein the second electrode comprises tin.

32. The memory device of claim 27 wherein the combined address line and electrode structure comprises tungsten, the chalcogenide glass material comprises germanium selenide, and the second electrode comprises one of tungsten and tin.

* * * * *